United States Patent
Werner et al.

(10) Patent No.: US 8,951,443 B2
(45) Date of Patent: Feb. 10, 2015

(54) ORGANIC SEMICONDUCTING MATERIAL AND ELECTRONIC COMPONENT

(75) Inventors: Ansgar Werner, Dresden (DE); Sascha Dorok, Dresden (DE); Carsten Rothe, Dresden (DE); Michael Felicetti, Halle (DE); Volker Lischewski, Bitterfeld-Wolfen OT Reuden (DE); Mirko Tschunarjew, Raguhn (DE)

(73) Assignees: Novaled AG, Dresden (DE); Sensient Imaging Technologies GmbH, Wolfen (DE)

( * ) Notice: Subject to any disclaimer, the term of this patent is extended or adjusted under 35 U.S.C. 154(b) by 255 days.

(21) Appl. No.: 13/643,611

(22) PCT Filed: Apr. 27, 2011

(86) PCT No.: PCT/DE2011/000441
§ 371 (c)(1),
(2), (4) Date: Mar. 6, 2013

(87) PCT Pub. No.: WO2011/134458
PCT Pub. Date: Nov. 3, 2011

(65) Prior Publication Data
US 2013/0193414 A1    Aug. 1, 2013

(30) Foreign Application Priority Data
Apr. 27, 2010   (DE) .......................... 10 2010 018 511

(51) Int. Cl.
*H01L 51/00* (2006.01)
*C09K 11/06* (2006.01)
*H01L 51/50* (2006.01)
*H01L 51/52* (2006.01)
*H05B 33/14* (2006.01)
*B32B 27/18* (2006.01)

(52) U.S. Cl.
CPC ............ *H01L 51/0032* (2013.01); *C09K 11/06* (2013.01); *H01L 51/002* (2013.01); *H01L 51/005* (2013.01); *H01L 51/006* (2013.01); *H01L 51/0072* (2013.01); *H01L 51/0077* (2013.01); *H01L 51/5048* (2013.01); *H01L 51/5052* (2013.01); *H01L 51/5234* (2013.01); *H05B 33/14* (2013.01); *B32B 27/18* (2013.01); *C09K 2211/1007* (2013.01); *C09K 2211/1014* (2013.01); *H01L 51/0051* (2013.01); *H01L 51/0059* (2013.01); *H01L 51/5012* (2013.01); *H01L 51/5088* (2013.01); *H01L 51/5092* (2013.01); *H01L 51/5096* (2013.01); *H01L 2251/5323* (2013.01); *Y02E 10/549* (2013.01)
USPC ...... 252/500; 252/519.21; 313/504; 558/434; 558/430; 546/330; 257/40; 428/500; 136/263

(58) Field of Classification Search
CPC ............ H01L 51/0032; H01L 51/0061; H01L 51/0059; H01L 31/00; B32B 27/18
USPC .............. 252/519.21, 500; 313/504; 558/434, 558/430; 546/330; 257/40; 428/500; 136/263
See application file for complete search history.

(56) References Cited

U.S. PATENT DOCUMENTS

| | | |
|---|---|---|
| 5,093,698 A | 3/1992 | Egusa |
| 5,457,565 A | 10/1995 | Namiki et al. |
| 5,458,977 A | 10/1995 | Hosokawa et al. |
| 5,503,910 A | 4/1996 | Matsuura et al. |
| 5,703,436 A | 12/1997 | Forrest et al. |
| 5,757,026 A | 5/1998 | Forrest et al. |
| 5,932,362 A | 8/1999 | Nagai et al. |
| 5,969,474 A | 10/1999 | Arai |
| 5,972,247 A | 10/1999 | Shi et al. |
| 6,013,384 A | 1/2000 | Kido et al. |
| 6,046,543 A | 4/2000 | Bulovic et al. |
| 6,201,346 B1 | 3/2001 | Kusaka |
| 6,284,393 B1 | 9/2001 | Hosokawa et al. |
| 6,515,314 B1 | 2/2003 | Duggal et al. |
| 6,541,908 B1 | 4/2003 | Cheung et al. |
| 6,566,807 B1 | 5/2003 | Fujita et al. |
| 6,589,673 B1 | 7/2003 | Kido et al. |
| 6,617,613 B2 | 9/2003 | Matsuo et al. |
| 6,908,783 B1 | 6/2005 | Kuehl et al. |
| 7,074,500 B2 | 7/2006 | Pfeiffer et al. |
| 7,274,141 B2 | 9/2007 | Leo et al. |
| 7,355,197 B2 | 4/2008 | Blochwitz-Nimoth et al. |

(Continued)

FOREIGN PATENT DOCUMENTS

| | | |
|---|---|---|
| EP | 0 498 979 A1 | 8/1992 |
| EP | 0 855 848 A1 | 7/1998 |

(Continued)

OTHER PUBLICATIONS

Benvenho et al., "Efficient Organic Light-Emitting Diodes with Fluorine-Doped Tin-Oxide Anode and Electrochemically Synthesized Sulfonated Polyaniline as Hole Transport Layer," Brazilian Journal of Physics, 2005, 35 (4A):1016-1019.

(Continued)

*Primary Examiner* — Douglas McGinty
(74) *Attorney, Agent, or Firm* — Sutherland Asbill & Brennan LLP

(57) ABSTRACT

Organic semiconducting material comprising at least one matrix material and at least one doping material, wherein the doping material is selected from a [3]radialene compound, and wherein the matrix material is selected from a terphenyldiamine compound, as well as an organic component and a mixture for producing a doped semiconductor layer.

18 Claims, 2 Drawing Sheets

(56) References Cited

U.S. PATENT DOCUMENTS

| | | | |
|---|---|---|---|
| 7,675,057 B2 | 3/2010 | Drechsel et al. | |
| 7,781,961 B2 | 8/2010 | Birnstock et al. | |
| 7,858,967 B2 | 12/2010 | Pfeiffer et al. | |
| 7,919,010 B2* | 4/2011 | Werner et al. | 252/301.16 |
| 7,981,324 B2 | 7/2011 | Hartmann et al. | |
| 8,057,712 B2 | 11/2011 | Zeika et al. | |
| 8,603,642 B2* | 12/2013 | Hatwar et al. | 428/617 |
| 8,617,426 B2* | 12/2013 | Hartmann et al. | 252/500 |
| 2006/0033115 A1 | 2/2006 | Blochwitz et al. | |
| 2007/0029927 A1 | 2/2007 | Kawamura et al. | |
| 2008/0265216 A1* | 10/2008 | Hartmann et al. | 252/500 |
| 2009/0235971 A1 | 9/2009 | Pfeiffer et al. | |
| 2010/0026176 A1 | 2/2010 | Blochwitz-Nomith et al. | |
| 2011/0315967 A1* | 12/2011 | Schmidhalter et al. | 257/40 |
| 2012/0168731 A1* | 7/2012 | Schildknecht et al. | 257/40 |
| 2012/0223296 A1* | 9/2012 | Werner et al. | 257/40 |
| 2013/0341613 A1* | 12/2013 | Nagao et al. | 257/40 |
| 2014/0070145 A1* | 3/2014 | Hartmann et al. | 252/500 |
| 2014/0070204 A1* | 3/2014 | Nagao et al. | 257/40 |

FOREIGN PATENT DOCUMENTS

| | | | | |
|---|---|---|---|---|
| EP | 0 891 121 A1 | 1/1999 | | |
| EP | 1 283 104 A1 | 2/2003 | | |
| EP | 1 535 731 A1 | 6/2005 | | |
| EP | 1 548 868 A1 | 6/2005 | | |
| EP | 2 072 517 A1 | 6/2009 | | |
| EP | 2 180 029 A1 | 4/2010 | | |
| EP | 2180029 A1 * | 4/2010 | | C09K 11/06 |
| EP | 2 299 509 A1 | 3/2011 | | |
| JP | 4-297076 A | 10/1992 | | |
| JP | 5-041286 A | 2/1993 | | |
| JP | 5-174975 A | 7/1993 | | |
| JP | 2001-332392 A | 11/2001 | | |
| JP | 2004002741 A * | 1/2004 | | |
| WO | 98/10473 A1 | 3/1998 | | |
| WO | 99/48337 A1 | 9/1999 | | |
| WO | 01/67825 A1 | 9/2001 | | |
| WO | 2006/062218 A1 | 6/2006 | | |
| WO | 2010/006890 A1 | 1/2010 | | |
| WO | 2010/132236 A1 | 11/2010 | | |
| WO | WO 2011131185 A1 * | 10/2011 | | |

OTHER PUBLICATIONS

Blochwitz et al., "Interface Electronic Structure of Organic Semiconductors with Controlled Doping Levels," Organic Electronics, 2001, 2:97-104.

Blochwitz et al., "Low Voltage Organic Light Emitting Diodes Featuring Doped Phthalocyanine as Hole Transport Material," Applied Physics Letters, 1998, 73(6):729-731.

Blochwitz, "Organic Light-Emitting Diodes with Doped Charged Transport Layers," Dissertation, 2001, 146 pages.

Burrows et al., "Semitransparent Cathodes for Organic Light Emitting Devices," Journal of Applied Physics, 2000, 87(6):3080-3085.

Despotovic et al., "The Structure and Stabjility of [3]-Radialenes and Their Dianions—A DFT Study," Journal of Molecular Structure: THEOCHEM, 2007, 811:313-322.

Dobbertin et al., "Inverted Hybrid Organic Light-Emitting Device with Polyethylene Dioxythiophene-Polystyrene Sulfonate as an Anode Buffer Layer," Applied Physics Journal, 2003, 83(24):5071-5073.

Enomoto et al., "Hexaaryl[3]Radialenes," Tetrahedron Letters, 1997, 38(15):2693-2696.

Groenendaal et al., "Poly(3,4-ethylenedioxythiophene) and its Derivatives: Past, Present, and Future," Advanced Materials, 2000, 12(7):481-494.

Gu et al., "High-Efficiency, Low-Drive-Voltage, Semitransparent Stacked Organic Light-Emitting Device," Applied Physics Letters, 1998, 73(17):2399-2401.

Gu et al., "A Metal-Free, Full-Color Stacked Organic Light-Emitting Device," Applied Physics Letters, 1999, 74 (2):305-307.

Gu et al., "Transparent Organic Light Emitting Devices," Applied Physics Letters, 1996, 68(19):2606-2608.

Huang et al., "Low-Voltage Organic Electroluminescent Devices Using Pin Structures," Applied Physics Letters, 2002, 80(1):139-141.

Hung et al., "Enhanced Electron Injection in Organic Electroluminescence Devices Using an Al/LiF Electrode," Applied Physics Letters, 1997, 70(2):152-154.

Hung et al., "Interface Engineering in Preparation of Organic Surface-Emitting Diodes," Applied Physics Letters, 1999, 74(21):3209-3211.

Hung et al., "Voltage Reduction in Organic Light-Emitting Diodes," Applied Physics Letters, 2001, 78(23):3732-3734.

Iyoda et al., "Novel Synthesis of Hexaaryl[3]Radialenes via Dibromo[3]Dendralenes," Tetrahedron Letters, 2000, 41:7059-7064.

Kido et al., "Bright Organic Electroluminescent Devices Having a Metal-Doped Electron-Injecting Layer," Applied Physics Letters, 1998, 73(20):2866-2868.

Kim et al., "Transparent Conducting Aluminum-Doped Zinc Oxide Thin Films for Organic Light-Emitting Devices," Applied Physics Letters, 2000, 76(3):259-261.

Kim et al., "Transparent Conducting Zr-Doped In2O3 Thin Films for Organic Light-Emitting Diodes," Applied Physics Letters, 2001, 78(8):1050-1052.

Li et al., "Fabrication and Electroluminescence of Double-Layered Organic Light-Emitting Diodes with Al2O3/Al Cathode," Applied Physics Letters, 1997, 70(10):1233-1235.

Nathan et al., "Transport of Sputtered Atoms in Facing Targets Sputtering Geometry: A Numerical Simulation Study," Journal of Applied Physics, 1998, 84(1):564-571.

Nollau et al., "Controlled N-Type Doping of a Molecular Organic Semiconductor: Naphthalenetetracarboxylic Dianhydride (NTCDA) Doped with bis(ethylenedithio)-tetrathiafulvalene (BEDT-TTF)," Journal of Applied Physics, 2000, 87(9):4340-4343.

Parthasarathy et al., "High-Efficiency Transparent Organic Light-Emitting Devices," Applied Physics Letters, 2000, 76(15):2128-2130.

Parthasarathy et al., "A Full-Color Transparent Metal-Free Stacked Organic Light Emitting Device with Simplified Pixel Biasing," Advanced Materials, 1999, 11(11):907-910.

Parthasarathy et al., "Lithium Doping of Semiconducting Organic Charge Transport Materials," Journal of Applied Physics, 2001, 89(9):4986-4992.

Parthasarathy et al., "A Metal-Free Cathode for Organic Semiconductor Devices," Applied Physics Letters, 1998, 72(17):2138-2140.

Pfeiffer et al., "A Low Drive Voltage, Transparent, Metal-Free n-i-p Electrophosphorescent Light Emitting Diode," Organic Electronics, 2003, 4:21-26.

Rabe et al., "Suitability of Lithium Doped Electron Injection Layers for Organic Semiconductor Lasers," Applied Physics Letters, 2007, 90(151103):1-3.

Scott et al., "Role of CsF on Electron Injection into a Conjugated Polymer," Applied Physics Letters, 2000, 77 (15):2403-2405.

Steel et al., "Anion-Directed Self-Assembly of Metallosupramolecular Coordination Polymers of the Radialene Ligand Hexa(2-pyridyl)[3]radialene," Inorganic Chemistry Communications, 2002, 5:323-327.

Stossel et al., "Electron Injection and Transport in 8-Hydroxyquinoline Aluminum," Synthetic Materials, 2000, 111-112:19-24.

Takahashi et al., "Novel Metallic Charge-Transfer Complexes Composed of a [3]Radialene Type Acceptor: A 1,2-Bis(p-benzoquino)=3-[2-(dicyanomethylene)-2,5-selenoquino]cyclopropane Derivative," Advanced Materials, 1995, 7(7):639-641.

Tang et al., "Organic Electroluminescent Diodes," Applied Physics Letters, 1987, 51(12):913-915.

Wu et al., "Surface Modification of Indium Tin Oxide by Plasma Treatment: An Effective Method to Improve the Efficiency, Brightness, and Reliability of Organic Light Emitting Devices," Applied Physics Letters, 1997, 70 (11):1348-1350.

Zhou et al., "Low-Voltage Inverted Transparent Vacuum Deposited Organic Light-Emitting Diodes Using Electric Doping," Applied Physics Letters, 2002, 81(5):922-924.

(56) References Cited

OTHER PUBLICATIONS

Zhou et al., "Very-Low-Operating-Voltage Organic Light-Emitting Diodes Using a p-doped Amorphous Hole Injection Layer," Applied Physics Letters, 2001, 78(4):410-412.

PCT International Search Report for PCT Application No. PCT/DE2011/000441 mailed Aug. 11, 2011 (8 pages).

PCT International Preliminary Report on Patentability for PCT Application No. PCT/DE2011/000441 mailed Nov. 8, 2012 (11 pages).

* cited by examiner

US 8,951,443 B2

ORGANIC SEMICONDUCTING MATERIAL AND ELECTRONIC COMPONENT

CROSS-REFERENCE TO RELATED APPLICATIONS

This is a submission pursuant to 35 U.S.C. 154(d)(4) to enter the national stage under 35 U.S.C. 371 for PCT/DE2011/000441, filed Apr. 27, 2011. Priority is claimed under 35 U.S.C. 119(a) and 35 U.S.C. 365(b) to German Patent Application Number 10 2010 018 511.6, filed Apr. 27, 2010. The subject matters of international application no. PCT/DE2011/000441 and German Patent Application No. 10 2010 018 511.6 are expressly incorporated herein by reference.

FIELD OF THE INVENTION

The present invention relates to an organic semiconducting material comprising at least one matrix material and at least one doping material, to an organic component that comprises such an organic semiconducting material, and to a mixture comprising at least one matrix material and at least one doping material for producing a doped semiconductor layer. The doping material is used to change the electrical properties of the matrix material.

BACKGROUND OF THE INVENTION

For some years it has been known that the electrical conductivity of organic semiconductors can be strongly influenced by doping (electrical doping). Such organic semiconducting matrix materials can be formed either from compounds having good electron donor properties or from compounds having good electron acceptance properties. Strong electron acceptors, such as tetracyanoquinodimethane (TCNQ) or 2,3,5,6-tetrafluoro-tetracyano-1,4-benzoquinodimethane (F4TCNQ) have been known for the doping of electron donor materials (HT) (U.S. Pat. No. 7,074,500). These produce what are known as "holes" in electron-donor-like base materials (hole transport materials) as a result of electron transfer processes, the conductivity of the base material being changed to a more or less significant extent as a result of the number and mobility of said holes. For example, N,N'-perarylated benzidines (TPD) or N,N',N''-perarylated starburst compounds, such as the substance TDATA, or else certain metal phthalocyanines, in particular such as zinc phthalocyanine (ZnPc), are known as matrix materials having hole transport properties.

However, the previously described compounds have disadvantages for a technical application in the production of doped semiconducting organic layers or of corresponding electronic components comprising doped layers of this type, since the manufacturing processes in large-scale production plants or those on a technical scale cannot always be controlled sufficiently precisely, which results in high control and regulation effort within the processes so as to achieve a desired product quality, or results in undesired tolerances of the products. Furthermore, there are disadvantages in the use of previously known organic doping agents with regard to the electronic component structures, such as light-emitting diodes (OLEDs), field-effect transistors (FETs) or solar cells, since the cited production difficulties encountered when handling the doping agents can lead to undesired irregularities in the electronic components or undesired ageing effects of the electronic components. However, it should be noted at the same time that the doping agents to be used have extremely high electron affinities (reduction potentials) and other properties suitable for the application in question since, for example, the doping agents also co-determine the conductivity or other electrical properties of the organic semiconducting layer under given conditions. The energetic positions of the HOMO of the matrix material and of the LUMO of the doping agent are decisive for the doping effect.

Electronic components comprising doped layers include, inter alia, OLEDs and solar cells. OLEDs are known for example from U.S. Pat. No. 7,355,197 or from US2009051271. Solar cells are known for example from US2007090371 and US2009235971.

BRIEF SUMMARY

The object of the present invention is to provide an organic semiconducting material that substantially overcomes the disadvantages from the prior art. In addition, improved organic components and mixtures of matrix material and doping material for producing a doped semiconductor layer are to be provided. These objects are achieved by the features of independent claims 1, 6 and 11. Preferred embodiments will emerge from the dependent claims. In a particularly preferred embodiment, the use of N,N'-bis(phenanthren-9-yl)-N,N'-bis(phenyl)-benzidine as a matrix material is excluded.

In accordance with a preferred alternative of the invention, the following layer sequences are provided in the organic component: (i) anode/doping agent/HTM (HTM=hole transport material); (ii) anode/doping agent:HTM. The following are also preferred: (iii) doping agent/HTM/EML or doping agent/HTM/OAS; (iv) p-doped HTM/EML or doping agent:HTM/OAS. The p-doped HTM is doped with the doping agents according to the invention. EML is the "emission layer" of an OLED; OAS stands for "optical absorption layer of a solar cell" (typically a D-A heterojunction).

The layer sequences (i)-(iv) are also preferably terminating layer sequences.

In the literature, hole transport layers to be doped or materials for forming these transport layers are either focussed on the properties of the doping agent or to the properties of the hole transport material. The respective other component is described with general reference to the prior art. In fact, as a general rule, better results are to be achieved for components comprising a doped hole transport layer than for a component having the same structure without doping agents in the hole transport layer. With this restricted view, however, the fact that, as a next step, the hole transport material and doping agent are to be adapted selectively to one another for complete optimisation of the overall properties of the component is overlooked. In particular, it is to be considered that the most suitable hole transport material for a doped layer is not necessarily the one that functions best as an undoped hole transport material. Rather, the doping agent and matrix form a system that has to be considered as a whole.

A central parameter for a hole transport material in an undoped layer is what is known as "charge carrier mobility" for holes. This determines the extent to which voltage falls over this layer when a specific current density flows through this layer. In an ideal scenario, the charge carrier mobility is so high that the voltage drop over the individual layer is negligible compared to the voltage drop over the entire component. In this case, this layer is no longer limiting for the current flow, and the charge carrier mobility can be considered to be sufficiently optimised.

In practice, this level has not yet been reached. In particular for colourless hole transport materials not absorbing in the visible spectral range, a nominal voltage is required to drive the current flow through hole transport layers. This is particularly true if the thickness of this layer is not only to be selected so as to be minimal, but must also have a specific minimum layer thickness (>50 nm), for example for process-related reasons or for reasons of component stability. In this case, the selection of a good hole transport material for this layer must be oriented primarily to a maximum charge carrier mobility, so as to limit the negative consequences on the performance parameter of the component. Other parameters that define the material, such as glass transition temperature (Tg), processing properties, cost to produce the material, are of secondary importance. For this reason, α-NPD (N,N'-bis(naphthalin-1-yl)-N,N'-bis(phenyl)-benzidine), with its very high charge carrier mobility, is one of the best hole transport materials, even in spite of its comparatively low glass transition temperature of just 96° C. As a result, α-NPD is also used commercially for the production of OLED products, even though the low glass transition temperature has been identified as a disadvantage of this solution, but has to be accepted.

The situation is different for a hole transport layer doped with [3]radialene compounds. The inventors have found that a minimal voltage drop over the doped hole transport layer can be achieved for a larger number of hole transport materials. Due to the doping effect of the [3]radialene compounds, the layer is conductive. The conductivities lie above the threshold value of 10-5 S/cm for a larger number of hole transport materials. For this conductivity, only 0.1 V falls with a comparatively high current density of 100 mA/cm2 over a comparatively high layer thickness of 100 nm. In particular for OLED components having a typical operating voltage of at least 3 V, this value is less significant. In this context, it is important to note that materials that demonstrated only unsatisfactory suitability in an undoped hole transport layer and therefore have not been used previously for the production of components are included among the hole transport materials functional in doped hole transport layers. Furthermore, it is important to note that this circumstance opens up new possibilities for the selection of hole transport materials for doped hole transport layers.

The inventors have discovered hole transport materials that exhibit a best possible performance capability in a doped hole transport layer, more specifically under consideration of those materials that have not been considered with a conventional approach.

As a result of this investigation, it has been found that the best combination of [3]radialene compounds and hole transport materials is not that which combines the [3]radialene compounds with the conventional best hole transport materials (those with high charge carrier mobility). This is demonstrated by the practical examples.

[3]radialene Compounds

Some preferred [3]radialenes will be shown below, which can be used advantageously for the purposes according to the invention:

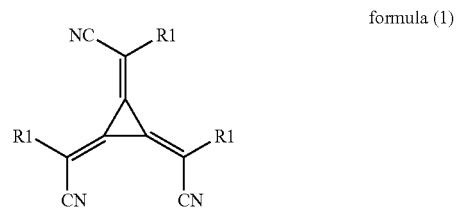

formula (1)

wherein each $R_1$ is selected independently from aryl and heteroaryl, wherein aryl and heteroaryl are substituted with electron-poor groups (acceptor groups), at least in part and preferably completely.

Aryl is preferably phenyl, biphenyl, α-naphthyl, β-naphthyl, phenantryl or anthracyl.

Heteroaryl is preferably pyridyl, pyrimidyl, triazyl or quinoxalinyl.

Acceptor groups are electron-attracting groups, preferably selected from fluorine, chlorine, bromine, CN, trifluoromethyl or nitro.

The general synthesis is described in patent application EP1988587 under "Preparation of the Oxocarbon, Pseudooxocarbon and Radialene Structures".

Selection of the Matrix Material

Suitable doping agents for organic semiconducting materials, such as hole transport materials HT, which are normally used in OLEDs or organic solar cells, are used in the present invention. The semiconducting materials are preferably intrinsically hole-conducting. It has been found that the following materials are suitable matrix materials and can be doped with [3]radialene compounds Matrix materials selected from compounds of the following formula are preferred

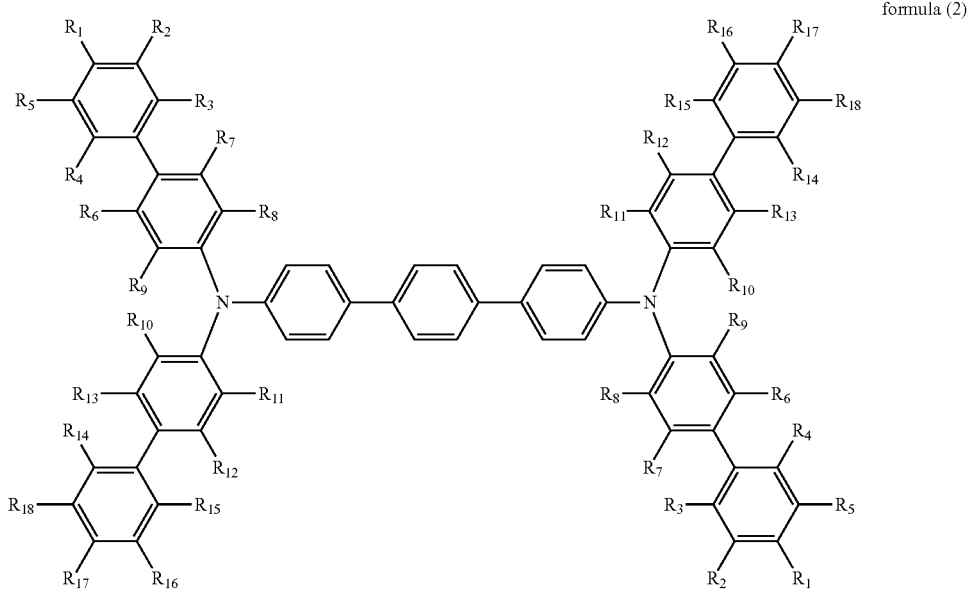

formula (2)

wherein $R_1$ to $R_{18}$ are each selected independently from H and alkyl (C1-C9, branched and unbranched).

Materials selected from the two following formulas are also preferred:

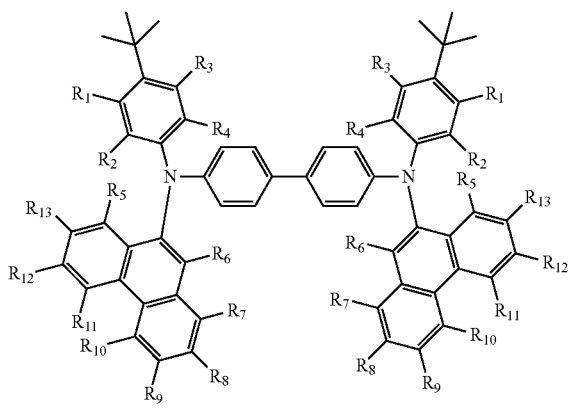

wherein $R_1$ to $R_{13}$: H and alkyl (C1-C9, branched and unbranched)

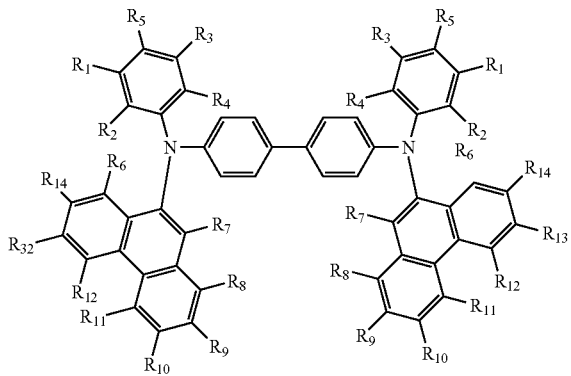

wherein $R_1$ to $R_{14}$: H and alkyl (C1-C9, branched and unbranched)

The materials of formulas (3), (4), (5) and (6) are also preferred. The matrix material of formula (3) is particularly preferred.

formula (3)

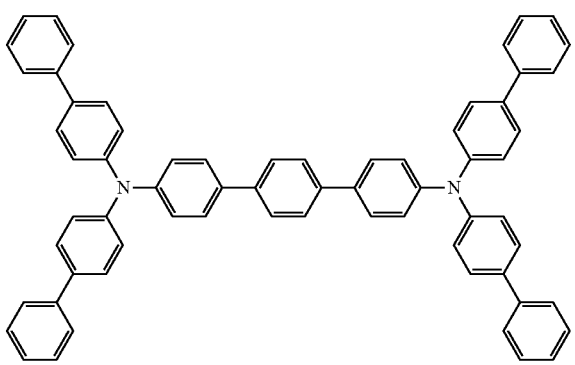

formula (4)

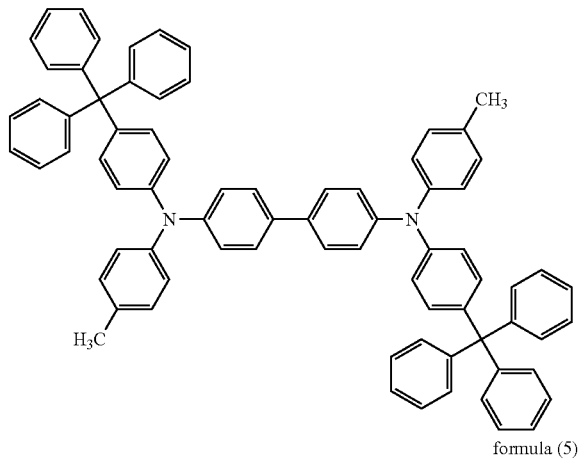

formula (5)

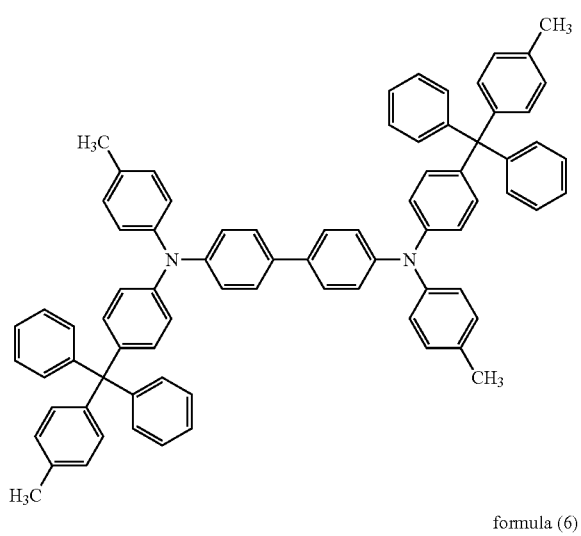

formula (6)

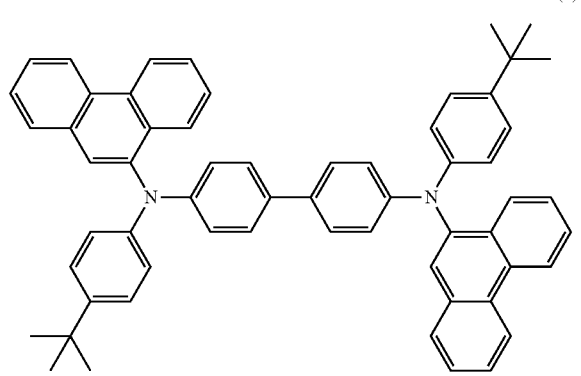

The following compounds are preferred: HTM of formula 3, HTM of formula 4, HTM of formula 5, HTM of formula 6, wherein HTM of formula 3 is the best material.

Matrix materials selected from formula (3), wherein at least one H of formula (3) is replaced by aromatic compounds and/or heteroaromatic compounds and/or C1-C20 alkyl, are also preferred.

Doped HTL (hole transport layer), wherein the matrix material is a material of the HTM of formula 4, HTM of formula 5, HTM of formula 6 and the doping agent is 2,2,2''-(cyclopropane-1,2,3-triylidene)tris(2-(p-cyanotetrafluorophenyl)acetonitrile), are also preferred.

A doped HTL, wherein the matrix material is HTM of formula 3 and the doping agent is 2,2',2"-(cyclopropane-1,2,3-triylidene)tris(2-(p-cyanotetrafluorophenyl) acetonitrile), is also preferred.

The present invention results in doped HTLs that have lower absorption, improved conductivity and/or improved thermal stability. On the whole, an improved overall performance compared to α-NPD is achieved.

ELECTRONIC COMPONENT

Figure 1A:
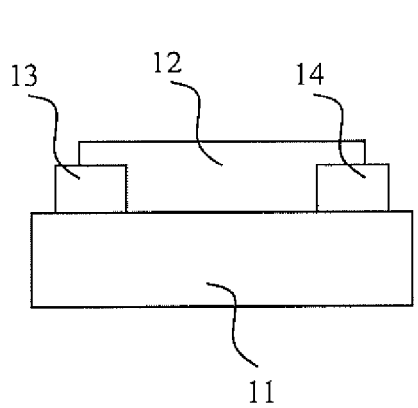
FIG. 1a shows a schematic illustration of a doped hole transport layer (12) on a substrate (11), wherein the hole transport layer (12) is contacted electrically by two electrodes (13) and (14). A planar structure is thus used, for example as a resistor, conductive pathway, etc.
Figure 1B:
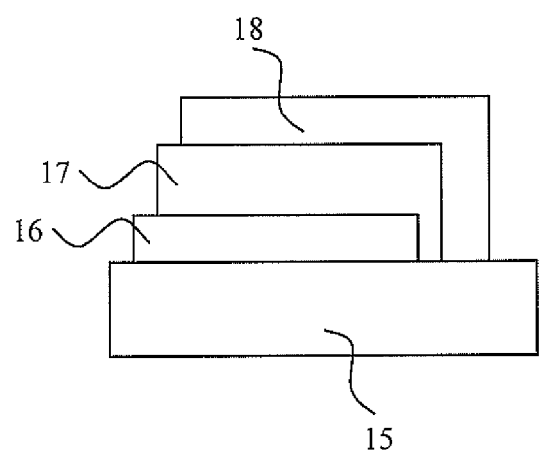
FIG. 1b shows a schematic illustration of a doped hole transport layer (17) between two electrodes (16) and (17) on a substrate (15). Further layers (18) may be provided. Such a stacked structure is used for example in OLEDs, organic solar cells, etc.

A multiplicity of electronic components or devices containing these components can be produced with use of the organic compounds according to the invention for producing doped organic semiconducting materials, which can be arranged in particular in the form of layers or electrical conduction pathways. In particular, the doping agents (doping material) can be used to produce organic light-emitting diodes (OLEDs), organic solar cells, organic diodes, in particular those having a high rectification ratio such as 103-107, preferably 104-107 or 105-107, or organic field-effect transistors. The conductivity of the doped layers and/or the improvement of the charge carrier injection of contacts into the doped layer can be improved by the doping agents according to the invention. In particular in the case of OLEDs, the component may have a pin structure or an inverted structure, without being limited to this. The use of the doping agents according to the invention is not limited to the above-mentioned advantageous exemplary embodiments however. OLEDs that are free from ITO (indium tin oxide) are preferred. Furthermore, OLEDs having at least one organic electrode are also preferred. (A) preferred organic electrode(s) is/are conductive layers that contain the following materials as primary components: PEDOT-PSS, polyaniline, carbon nanotubes, graphite.

The typical structure of a standard OLED can be considered as follows:
1. carrier, substrate, for example glass
2. electrode, hole-injecting (anode=positive terminal), preferably transparent, for example indium tin oxide (ITO) or FTO (Brat. J. Phys. vol. 35 no.4 p.1016-1019 (2005))
3. hole injection layer,
5. hole-side blocking layer so as to prevent exciton diffusion from the emission layer and to prevent charge carrier leakages from the emission layer
6. light-emitting layer or system of a plurality of layers contributing to light emission, for example CBP (carbazole derivatives) with emitter admixture (for example phosphorescent triplet emitter iridium-tris-phenylpyridine Ir(ppy)3) or Alq3 (tris-quinolinato aluminum) mixed with emitter molecules (for example fluorescent singlet emitter coumarin),
7. electron-side blocking layer to prevent exciton diffusion from the emission layer and to prevent charge carrier leakages from the emission layer, for example BCP (bathocuproine),
8. electron transport layer (ETL), for example BPhen, Alq3 (tris-quinolinato aluminum),
10. electrode, generally a metal with low work function, electron-injecting (cathode=negative terminal), for example aluminum.

Of course, layers can be omitted or a layer (or a material) may fulfill a plurality of properties, for example layers 3-5 or layers 7 and 8 can be combined. Further layers may also be used. Stacked OLEDs are also intended and included.

This structure describes the non-inverted (anode on the substrate) structure of an OLED emitting on the substrate side (bottom emission). There are various concepts to describe OLEDs emitting away from the substrate (see references in DE102 15 210.1), all of which share the common feature that the substrate-side electrode (the anode in the non-inverted case) is then reflective (or transparent for a transparent OLED) and the cover electrode is (semi-)transparent. If the sequence of the layers is inverted (cathode on substrate), reference is made to inverted OLEDs (see references in DE101 35 513.0). In this case too, performance losses are to be expected if specific measures are not taken.

A preferred design of the structure of an OLED according to the invention is the inverted structure (wherein the cathode is on the substrate), and wherein the light is emitted through the substrate. It is further preferred if the OLED is top emitting.

The typical structure of an organic solar cell can be considered as follows:
1. carrier, substrate, for example glass
2. anode, preferably transparent, for example indium tin oxide (ITO)
3. hole injection layer,
5. hole-side intermediate layer, preferably a blocking layer, so as to prevent exciton diffusion from the absorption layer (optical active layer, also called an emission layer) and to prevent charge carrier leakages from the emission layer,
6. optical active layer (absorption layer), typically a strongly light-absorbing layer formed of a heterojunction (two or more layers or a mixed layer), for example a mixed layer formed of C60 and ZnPc,
7. electron transport layer,
10. cathode, for example aluminum.

Of course, layers can be omitted or a layer may fulfill a plurality of properties. Further layers may also be used. Stacked (tandem) solar cells are also intended and included. Variants such as transparent solar cells, solar cells of inverted structure or m-i-p solar cells are also possible.

A preferred design of the structure of a solar cell is the inverted structure (wherein the cathode is on the substrate), and wherein the light is incident through the substrate.

A further preferred design of the structure of a solar cell is the inverted structure (wherein the cathode is on the substrate), and wherein the light is incident through the anode.

PRACTICAL EXAMPLES

The invention will be explained in greater detail on the basis of some practical examples.

Synthesis of the [3]radialene Compounds

A solution of 207 mmol cyanoacetic ester in 50 ml dimethylformamide was quickly added dropwise, with stirring, to a solution of 207 mmol starting material (a-e) and 250 mmol potassium carbonate in 370 ml dimethylformamide. This mixture was stirred for 48 h at room temperature. The mixture was then added to 1 l ice water. The solution was stirred vigorously and mixed with 100 ml concentrated acetic acid. This aqueous solution was then extracted four times with chloroform. The purified organic phases were then fully concentrated under vacuum after drying with magnesium sulphate. The raw product was used in the next synthesis without further purification.

The entire quantity of aryl cyanoacetic ester (f-j) was heated in in 84 ml acetic acid (50%) together with 4.15 ml concentrated sulphuric acid for 16 h at reflux. After cooling, the entire quantity was added to 120 ml ice water and stirred for 30 min. The phases were separated and the aqueous phase was extracted with 100 ml chloroform. The purified organic phases were washed with 100 ml water and then with 100 ml saturated sodium bicarbonate solution. After drying with magnesium sulphate and after removal of the solvent, colourless oils (k-o) were obtained after distillation under vacuum.

Lithium hydride (98%) was suspended in 600 ml glyme and cooled to 0° C. 152 mmol of aryl acetonitrile (k-o) were slowly added dropwise in 60 ml glyme. The ice bath was removed, and the mixture was left to heat to room temperature. After 15 min of stirring at room temperature, the mixture was re-cooled to 0° C. and 40.0 mmol tetrachloropropene in 40 ml glyme were slowly added dropwise. Once heated to room temperature, the mixture was stirred for a further 44 h. The mixture was then added to 1.2 l ice water and acidified using hydrochloric acid (pH=1). The aqueous solution was shaken out three times, each time with 500 ml ethyl acetate, and the purified organic phases were first washed with saturated common salt solution, then with water, then with sodium carbonate solution, and lastly again with water. It was dried with magnesium sulphate and the solvent was removed under vacuum. The remaining dark-brown oil was used in the next synthesis without further purification.

The material was dissolved in 1.4 l acetic acid and mixed dropwise, with stirring, with a previously prepared mixture formed of 360 ml hydrobromic acid (48%) and 120 ml nitric acid (65%). This was stirred for 1.5 h and then filtered. The red solid was washed with water, dried under vacuum and then purified by gradient sublimation (p-t).

| Starting material | Aryl cyanoacetic ester |
|---|---|
| Hexafluorobenzene (a) | (f) Ethyl-2-cyano-2-(perfluorophenyl)acetate |
| Pentafluoropyridine (b) | (g) Ethyl-2-cyano-2-(perfluoropyridin-4-yl)acetate |
| Pentafluorobenzonitrile (c) | (h) Ethyl-2-cyano-2-(4-cyanoperfluorophenyl)acetate |
| Octafluorotoluene (d) | (i) Ethyl-2-cyano-2-(4-trifluoromethylperfluorophenyl)-acetate |
| 4-trifluoromethyl-2,6-dichloro-1,3,5-trifluorobenzene (e) | (j) Ethyl-2-cyano-2-(4-trifluoromethyl-2,6-dichloro-3,5-difluorophenyl)acetate |

| Intermediate products, aryl acetonitriles | End products, [3]radialenes |
|---|---|
| (k) Pentafluorophenylacetonitrile | (p) (2E,2'E,2''E)-2,2',2''-(cyclopropane-1,2,3-triylidene)tris(2-(perfluorophenyl)-acetonitrile) |
| (l) 4-(cyanomethyl)-2,3,5,6-tetrafluoropyridine | (q) (2E,2'E,2''E)-2,2',2''-(cyclopropane-1,2,3-triylidene)tris(2-(perfluoropyridin-4-yl)-acetonitrile) |
| (m) 4-(cyanomethyl)-2,3,5,6-tetrafluorobenzonitrile | (r) (2E,2'E,2''E)-2,2',2''-(cyclopropane-1,2,3-triylidene)tris(2-(4-cyanoperfluorophenyl)-acetonitrile) |
| (n) 2-(2,3,5,6-tetrafluoro-4-(trifluoromethyl)phenyl)-acetonitrile | (s) (2E,2'E,2''E)-2,2',2''-(cyclopropane-1,2,3-triylidene)tris(2-(2,3,5,6-tetrafluoro-4-(trifluoromethyl)phenyl)-acetonitrile) |
| (o) (4-trifluoromethyl-2,6-dichloro-3,5-difluorophenyl)-acetonitrile | (t) (2E,2'E,2''E)-2,2',2''-(cyclopropane-1,2,3-triylidene)tris(2-(2,6-dichloro-3,5-difluoro-4-(trifluoromethyl)phenyl)-acetonitrile) |

Synthesis of the HTM
Example HTM of Formula 3

A 0.5-1 l round-bottomed flask is filled with 70 g (0.14 mol) 4,4''-diiodoterphenyl, 140 g (0.44 mol) bis-(biphenylyl)-amine, 45 g potassium carbonate, 220 ml Marlotherm and 0.3 ml toluene. The mixture is heated to 110° C. and 20 g copper catalyst are added. The mixture is heated to a temperature of approximately 195° C. within 3.5 hours. This temperature is maintained for 42 hours. Then, the batch is cooled to 90° C. and drawn off via a suction filter to release inorganic components. 100 ml methanol are added and the product is drawn off under vacuum via a suction filter. The product is then recrystallized from 2 l dimethylformamide. Once the product of recrystallization has been drawn off it is washed again with 200 ml methanol to remove occluded dimethylformamide.

83 g of products are obtained after drying at 100° C.

| HTM | Glass transition temperature $T_G$ |
|---|---|
| HTM of formula 3 | 141° C. |
| HTM of formula 4 | 146° C. |
| HTM of formula 5 | 143° C. |
| HTM of formula 6 | 168° C. |

Measurement Methods

The conductivity of a thin-layer sample is measured using the 2-point method. In this case, contacts made from a conductive material, for example gold or indium tin oxide, are applied to a substrate. The thin layer to be examined is then deposited over a large area of the substrate, so that the contacts are covered by the thin layer. After applying a voltage to the contacts, the current that flows is then measured. The conductivity of the thin-layer material is then determined from the resistance value thus obtained on the basis of the geometry of the contacts and the layer thickness of the sample. The 2-point method is permissible if the resistance of the thin layer is significantly greater than the resistance of the feed lines or the contact resistance. This is assured experimentally by providing a sufficiently large contact gap, thus enabling the linearity of the current-voltage characteristic curve to be verified.

Thermal stability can be determined using the same method and the same structure by heating the (doped or undoped) layer incrementally and measuring its conductivity after a rest period. The maximum temperature the layer can sustain without losing the desired semiconducting property is then the temperature immediately before conductivity breaks down. For example, a doped layer may be heated in increments of 1° C. on a substrate with two adjacent electrodes, as described above, with a waiting interval of 10 seconds between each increment. Then, conductivity is measured. The conductivity changes as the temperature changes, and above a certain temperature it breaks down suddenly. Thermal stability thus provides the temperature up to which conductivity does not abruptly break down.

Doping Concentration

The doping agent is preferably present in a doping concentration of ≤1:1 relative to the matrix molecule or the monomer unit of a polymer matrix molecule, preferably in a doping concentration of 1:2 or less, more preferably of 1:5 or less or 1:10 or less. The doping concentration may be restricted in the range from 1:5 to 1:10000.

The Doping Procedure

The doping of the respective matrix material with the p-doping agents to be used in accordance with the invention may be carried out in one or a combination of the following processes:

a) Mixed evaporation under vacuum with one source for the matrix material and one for the doping agent.

coated with ITO by mixed evaporation of the HTM of formula 3 together with doping agent (p) under high vacuum. The concentration of the doping agent in the matrix was 1.5; 3.0; 4.5 wt %. In addition, an α-NPD layer doped with 3 wt % of compound (p) was deposited on the same substrate as a reference. Subsequently, a layer of α-NPD, a fluorescent blue emitter layer, an undoped ETL and blocking layer, an n-doped electron transport layer and an aluminum cathode were deposited without breaking the vacuum. The components processed in this way were then protected from water by encapsulating in a covering glass—an appropriate getter had been introduced in advance.

Blue OLEDs that emit through the glass substrate are thus produced, the characteristic data of said OLEDs being summarised in the table below.

| HTL: doping with (p) | Voltage/V [at 10 mA/cm$^2$] | Current efficiency (cd/A) [at 1000 cd/m$^2$] | Power efficiency/ (lm/W) [at 1000 cd/m$^2$] | Quantum efficiency/% [at 1000 cd/m$^2$] | Service life/h [at 30 mA/cm$^2$] | Service life/h [at 60 mA/cm$^2$] |
|---|---|---|---|---|---|---|
| HTM of formula 3, 1.5 wt % | 3.21 | 11.12 | 10.93 | 6.64 | 497 | 225 |
| HTM of formula 3, 3.0 wt % | 3.2 | 10.85 | 10.72 | 6.48 | 556 | 252 |
| HTM der of formula 3, 4.5 wt % | 3.18 | 10.5 | 10.41 | 6.33 | 547 | 262 |
| α-NPD, 3.0 wt % | 3.26 | 10.52 | 10.18 | 6.51 | 476 | 225 | b) Doping of a matrix layer by a solution of p-doping agent with subsequent evaporation of the solvent, particularly by thermal treatment c) Surface doping of a matrix material layer by a layer of doping agent applied to the surface thereof d) Preparation of a solution of matrix molecules and doping agent followed by production of a layer from this solution by conventional methods, such as evaporation of the solvent or spin-coating In this way, it is thus possible in accordance with the invention to produce p-doped layers of organic semiconductors that can be used in a versatile manner.

Conductivity Measurements

Doped Semiconductor Layer

Example 1

A 50 nm thick layer of the HTM of formula 3 was doped with compound (p). The doped layer was produced by mixed evaporation of the HTM of formula 3 and doping agent (p) under high vacuum. The concentration of the doping agent in the matrix was 3 mol %. The evaporation temperature of the doping agent was 372° C. The doped layer demonstrated high conductivity of 6·10-4 S/cm. The thermal stability of the layer was 133° C.

Components:

Example 1

A layer of the HTM of formula 3 was doped with compound (p). The doped layer was deposited on a glass substrate It can be seen from the table that the operating voltage with use of the HTM of formula 3 is improved relative to α-NPD. This lower initial voltage then also leads to better efficiencies. For example, the power efficiency of 10.18 for the reference improves to 10.72 lm/W with use of the HTM of formula 2, wherein both HTM of formula 3 and α-NPD have been (p) doped with 3 wt %. The improvement in efficiency is thus more than 5%. A further important performance parameter of OLED components is the service life defined as length of time until the initial brightness at a specific current density falls by half. It can be seen from the table that, in this case too, no losses have to be sustained with use of the HTM of formula 3 relative to α-NPD. By contrast, the service life at 30 mA/cm$^2$ improves by more than 15% from 476 to 556 h in the above example with 3 wt % electrical doping.

Example 2

A layer of the HTM of formula 3 was doped with compound (p). The doped layer was deposited on a glass substrate coated with ITO by mixed evaporation of the HTM of formula 2 together with doping agent (p) under high vacuum. The concentration of the doping agent in the matrix was 3.0 wt %. In addition, an α-NPD layer doped with 3 wt % of compound (p) was deposited on the same substrate as a reference. Subsequently, a layer of α-NPD or a layer of the HTM of formula 3 was deposited without breaking the vacuum. The component was completed by a fluorescent red emitter layer, an undoped ETL and blocking layer, an n-doped electron transport layer and an aluminum cathode. The components processed in this way were then protected from water by encapsulating in a covering glass—an appropriate getter had been introduced in advance.

Red OLEDs that emit through the glass substrate are thus produced, the characteristic data of said OLEDs being summarised in the table below.

| HTL: doping with (p) | Undoped HTL | Voltage/V [at 10 mA/cm$^2$] | Power efficiency/ (lm/W) [at 10000 cd/m$^2$] | Quantum efficiency/% [at 10000 cd/m$^2$] |
|---|---|---|---|---|
| HTM of formula 3 | HTM of formula 2 | 2.68 | 8.4 | 7.0 |
| HTM of formula 3 | α-NPD | 2.70 | 7.1 | 6.2 |
| α-NPD | HTM of formula 2 | 2.73 | 8.5 | 7.2 |
| α-NPD | α-NPD | 2.69 | 7.8 | 6.5 |

It can be seen from the table that the efficiency of the red OLED improves considerably with use of the HTM of formula 3 as a doped and undoped layer relative to a reference OLED, where both of these layers consists of the standard material α-NPD. In this specific case, the power efficiency improves, for example, from 7.8 to 8.4 lm/W and therefore by approximately 8%.

Example 3

A further component example shall demonstrate the surprising thermal stability of the doped semiconductor layers. To this end, a layer 30 nm thick layer of each of the HTM of formula 4, the HTM of formula 5 and the HTM of formula 6 was processed on ITO glass. In addition, a reference layer of 30 nm α-NPD was applied. All of these materials were doped electrically with (p) 3% by co-evaporation. A uniform layer 50 nm thick of a highly stable hole-transporting material TBRb (tert butyl rubrene) was evaporated as additional resistance on all of these layers. The hole-transporting components were terminated by a common aluminum electrode 100 nm thick. The components processed in this way were then protected from water by encapsulating in a covering glass—an appropriate getter had been introduced in advance.

Figure 2:
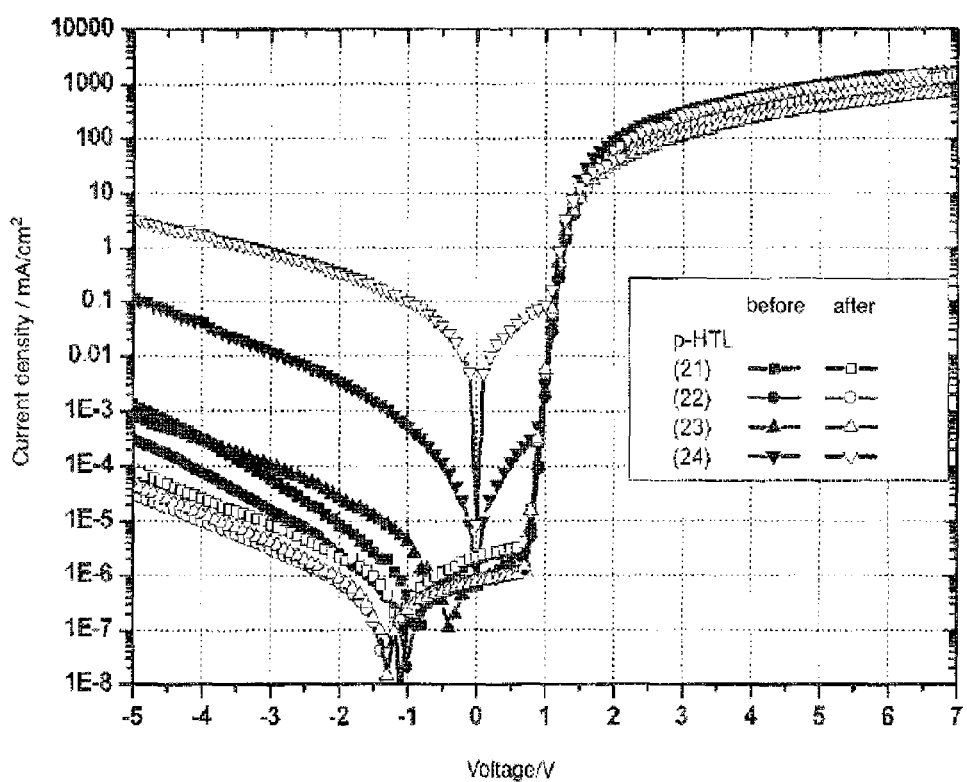
FIG. 2 shows an illustration of diode characteristic curves.

The current-voltage characteristic curves of the components thus obtained were measured. For the purposes of estimating the thermal stability, all OLEDs were then heated in a furnace for one hour to 120° C. After cooling to room temperature, the current-voltage characteristic curves were then measured again. The diode characteristic curves thus obtained are illustrated in FIG. 2, wherein (21) shows HTM of formula 6, (22) shows HTM of formula 5, (23) shows HTM of formula 3 and (24) shows the I-V data of α-NPD.

The characteristic curves can be divided roughly into desired forward currents for voltages greater than 1 V and parasitic leakage currents for voltages less than 1 V. In this case, 1 V is the turn-on voltage of the component. It can be clearly seen that the α-NPD component has much higher leakage currents relative to the materials according to the invention, HTM of formula 3, HTM of formula 4, HTM of formula 5 and HTM of formula 6, even directly after processing. The difference, for example at -5 V, is approximately 2 orders of magnitude. The problem of parasitic leakage currents amplifies further for α-NPD after heating. In this case, the leakage currents reach almost 10 mA/cm2 at -5 V. By contrast, components that use hole transport layers according to the invention are much more tolerant to an increase in temperature and, at -5 V, lie more than five orders of magnitude below the reference value of α-NPD at approximately 0.0001 mA/cm2. The example demonstrates that organic components that are much more thermally stable can be produced using hole transport materials according to the invention than when using the standard hole transport material α-NPD.

Example 4

Four layers consisting of HTM (see table below) were doped with compound (p). The doped layers were deposited on a glass substrate coated with ITO by mixed evaporation together with doping agent (p) under high vacuum. The concentration of the doping agent in the matrix was 3.0 wt % in each of the four cases. In addition, an α-NPD layer doped with 3 wt % of compound (p) was deposited on the same substrate as a reference. Subsequently, a layer of α-NPD, a red-, a yellow-, a blue- and a green-emitting layer, an undoped ETL and blocking layer, an n-doped electron transport layer and an aluminum cathode were deposited without breaking the vacuum. The components processed in this way were then protected from water by encapsulating in a covering glass—an appropriate getter had been introduced in advance.

The OLED thus processed emits warm white light with colour coordinates of (0.39, 0.40). The corresponding characteristic data are summarised in the table below.

| HTL: doping with 3 wt % (p) | Voltage/V [at 10 mA/cm$^2$] | Power efficiency/ (lm/W) [at 1000 cd/m$^2$] | Quantum efficiency/% [1000 cd/m$^2$] | Service life at 85° C./h [at 30 mA/cm$^2$] |
|---|---|---|---|---|
| HTM of formula 3 | 3.1 | 16 | 6.6 | 120 |
| HTM of formula 4 | 3.18 | 15.81 | 6.49 | 82 |
| HTM of formula 5 | 3.3 | 14.23 | 6.26 | 86 |
| HTM of formula 6 | 3.34 | 13.5 | 6.19 | 100 |
| α-NPD | 3.09 | 15.6 | 6.36 | 74 |

It can be seen from the table that the initial efficiency of the components with use of a hole transport layer according to the invention is partly slightly better and partly slightly poorer relative to the standard hole transport material α-NPD. On the other hand, considerable improvements are achieved with regard to the service lives of the components in accordance with the above definition measured at 85° C. The latter improves by up to 35%, for example with use of the HTM of formula 6.

The features of the invention disclosed in the description above, in the claims and in the drawings may be essential, both individually and in any combination, to the implementation of the invention in its various embodiments.

The invention claimed is:

1. An organic semiconducting material comprising at least one matrix material and at least one doping material, wherein the doping material is selected from compounds of formula (1)

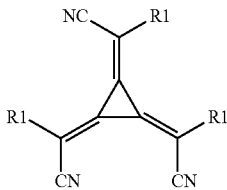
formula (1)

wherein R1 is selected independently from aryl and heteroaryl, wherein aryl and heteroaryl are substituted with at least one electron-poor substituent, and wherein the matrix material is selected from compounds of formula (2)

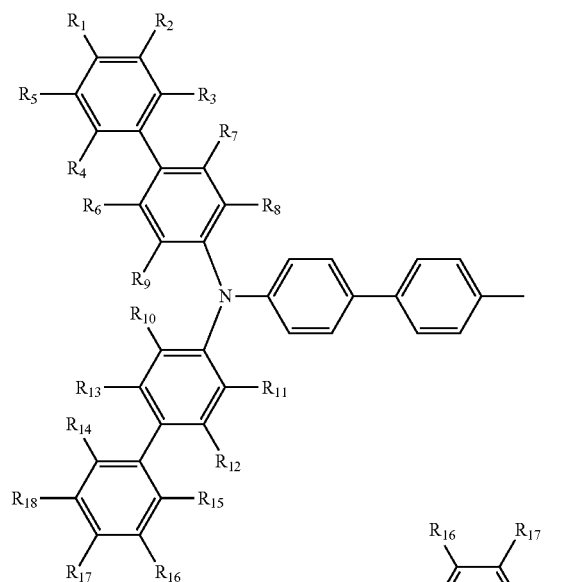
formula (2)

wherein $R_1$ to $R_{18}$ are each selected independently from H and alkyl, wherein alkyl is branched or unbranched.

2. The organic semiconducting material according to claim 1, wherein the doping material is incorporated into the matrix material.

3. The organic semiconducting material according to claim 1, wherein the doping material and the matrix material form two layers, which are in contact.

4. The organic semiconducting material according to claim 1, wherein the doping material and the matrix material are mixed with one another.

5. The organic semiconducting material according to claim 1, wherein the doping material is selected from:

2,2',2''-(cyclopropane-1,2,3-triylidene)tris(2-(perfluorophenyl)-acetonitrile);

2,2',2''-(cyclopropane-1,2,3-triylidene)tris(2-(perfluoropyridin-4-yl)-acetonitrile);

2,2',2''-(cyclopropane-1,2,3-triylidene)tris(2-(4cyanoperfluorophenyl)-acetonitrile);

2,2',2''-(cyclopropane-1,2,3-triylidene)tris(2-(2,3,5,6tetrafluoro-4-(trifluoromethyl)phenyl)-acetonitrile); or (cyclopropane-1,2,3-triylidene)tris(2-(2,6-dichloro-3,5-difluoro-4-(trifluoromethyl)phenyl)-acetonitrile).

6. An organic component comprising an organic semiconducting material according to claim 1.

7. The organic component according to claim 6, wherein the component is a light-emitting component.

8. The organic component according to claim 6, wherein the component is an organic solar cell.

9. The organic component according to claim 8, wherein the component comprises a cathode, an anode, and a substrate, and the cathode is arranged closer to the substrate than the anode.

10. The organic component according to claim 9, wherein the cathode is transparent, and the substrate and/or the anode is/are reflective.

11. A mixture comprising at least one matrix material and at least one doping material for producing a doped semiconductor layer, wherein the doping material is selected from compounds of formula (1)

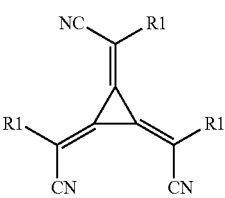
formula (1)

wherein R1 is selected independently from aryl and heteroaryl, wherein aryl and heteroaryl are substituted with at least one electron-poor substituent, and wherein the matrix material is selected from compounds of formula (2)

formula (2)

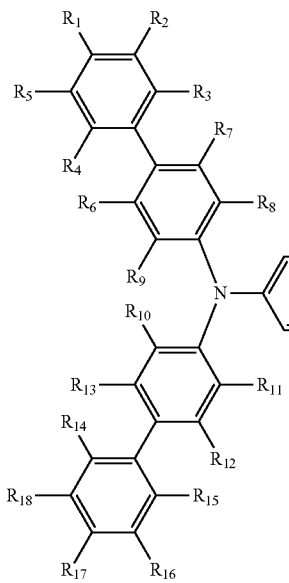
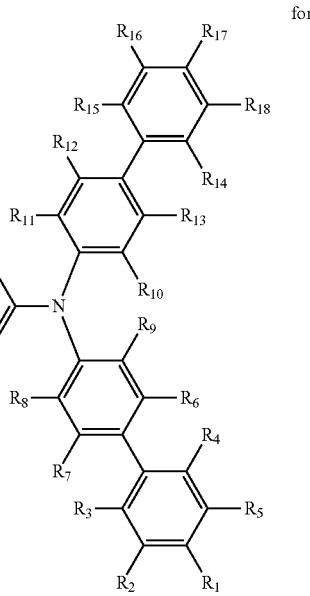

wherein $R_1$ to $R_{18}$ are each selected independently from H and alkyl, wherein alkyl is branched or unbranched.

12. The mixture according to claim 11, wherein the matrix material is N4,N4,N4'',N4''-tetra([1,1'-biphenyl]-4-yl)-[1,1': 4',1''-terphenyl]-4,4''-diamine.

13. The mixture according to claim 11, wherein the doping material is selected from:

2,2',2''-(cyclopropane-1,2,3-triylidene)tris(2-(perfluorophenyl)-acetonitrile);

2,2',2''-(cyclopropane-1,2,3-triylidene)tris(2-(perfluoropyridin-4-yl)-acetonitrile);

2,2',2''-(cyclopropane-1,2,3-triylidene)tris(2-(4-cyanoperfluorophenyl)-acetonitrile);

2,2',2''-(cyclopropane-1,2,3-triylidene)tris(2-(2,3,5,6-tetrafluoro-4-(trifluoromethyl)phenyl)-acetonitrile); or (cyclopropane-1,2,3-triylidene)tris(2-(2,6-dichloro-3,5-difluoro-4-(trifluoromethyl)phenyl)-acetonitrile).

14. The organic semiconducting material according to claim 1, wherein aryl and heteroaryl are substituted completely with at least one electron-poor substituent.

15. The organic semiconductor material according to claim 1, wherein alkly is $C_1$-$C_9$ alkyl.

16. The organic semiconducting material according to claim 4, wherein the mixed materials are a doped semiconductor layer.

17. The mixture according to claim 11, wherein aryl and heteroaryl are substituted completely with at least one electron-poor substituent.

18. The mixture according to claim 11, wherein alkly is $C_1$-$C_9$ alkyl.

* * * * *